US006797439B1

(12) United States Patent
Alpay

(10) Patent No.: US 6,797,439 B1
(45) Date of Patent: Sep. 28, 2004

(54) PHOTOMASK WITH BACK-SIDE ANTI-REFLECTIVE LAYER AND METHOD OF MANUFACTURE

(75) Inventor: Hakki Ufuk Alpay, Poughquag, NY (US)

(73) Assignee: Schott Lithotec AG, Jenna (DE)

( * ) Notice: Subject to any disclaimer, the term of this patent is extended or adjusted under 35 U.S.C. 154(b) by 140 days.

(21) Appl. No.: 10/113,007

(22) Filed: Mar. 29, 2002

Related U.S. Application Data

(60) Provisional application No. 60/280,562, filed on Mar. 30, 2001.

(51) Int. Cl.[7] .............................. G03F 9/00; G03C 5/00
(52) U.S. Cl. ......................................... 430/5; 430/394
(58) Field of Search .......................... 430/5, 322, 323, 430/394; 378/35

(56) References Cited

U.S. PATENT DOCUMENTS

| | | | |
|---|---|---|---|
| 6,251,545 B1 | * | 6/2001 | Levinson ........................ 430/5 |
| 6,623,893 B1 | * | 9/2003 | Lyons et al. .................... 430/5 |
| 2001/0028983 A1 | * | 10/2001 | Kawamura et al. ............ 430/5 |

* cited by examiner

Primary Examiner—S. Rosasco
(74) Attorney, Agent, or Firm—Baker Botts L.L.P.

(57) ABSTRACT

A photomask and method for coating a backside of the same with an antireflective material are disclosed. The photomask includes a transparent substrate with a front-side and a backside. The front-side absorber layer has a patterned absorber layer formed thereon. An anti-reflective layer is deposited on the backside of the substrate. More particularly, the antireflective coating may have a refractive index between 1.4 and 1.8. The anti-reflective layer allows the photomask to reduce unwanted reflections within a lithography system and therefore improve system efficacy and throughput.

20 Claims, 2 Drawing Sheets

PHOTOMASK WITH BACK-SIDE ANTI-REFLECTIVE LAYER AND METHOD OF MANUFACTURE

CROSS REFERENCE TO RELATED APPLICATION

This application claims priority from U.S. Provisional Patent Application Ser. No. 60/280,562, filed Mar. 30, 2001 by Hakki Ufuk Alpay, and entitled "Photomask and Method for Coating a Backside of the Same With An Anti-Reflective Material."

TECHNICAL FIELD OF THE INVENTION

This invention relates in general to photolithography and, more particularly, to a photomask and method for coating a back-side of the same with an anti-reflective material.

BACKGROUND OF THE INVENTION

Photolithography systems use an illumination source and a photomask assembly to project an image on to the surface of a semiconductor wafer. A photomask assembly typically includes a photomask with a patterned absorber layer formed on the front-side of a transparent substrate and a pellicle mounted on the photomask to protect the photomask from contaminants in the photolithography system. Complex geometries, such as integrated circuits (ICs), are formed on the surface by passing radiant energy from the illumination source through apertures in the patterned layer of the photomask and focusing the image on a layer of resist that is coated on the wafer.

The radiant energy directed at a photomask assembly will either pass through the photomask (sometimes referred to as transmission), be absorbed within the photomask, or be reflected off of the photomask. For photomasks in which absorption remains substantially constant, any decrease in reflection results in an increase in transmission through the photomask. Traditionally, an anti-reflective coating may be added to the front-side of the photomask over the patterned absorber layer to reduce the amount of reflection from the surface.

In other embodiments, conventional photomasks have included two layers of anti-reflective coating. A first anti-reflective layer is formed directly on the front side of the substrate and a second anti-reflective layer is formed on the patterned absorber layer. In such a photomask, the absorber layer is located between the two anti-reflective layers. These techniques may reduce reflection, however, transmission loss still occurs due to reflection from other portions of the photomask. Additionally, the anti-reflective layer formed on the front-side of the substrate may introduce stresses on the substrate causing the photomask to bend or warp. Such bending or warping may distort the image when projected onto a target wafer, thereby leading to defects and errors in the resulting wafers.

Additionally, unwanted reflection off of a photomask may exacerbate so called iso-dense bias effects. Iso-dense bias is a common optical proximity effect that creates a difference between the printed dimensions of an isolated feature and a dense feature having the same design dimensions. In dense areas, more light is reflected from dense areas of an absorber layer. This causes more light to be reflected onto the wafer surface. Such unwanted reflected light increases the likelihood of critical dimension and pattern registration errors.

SUMMARY OF THE INVENTION

In accordance with the teachings of the present invention, disadvantages and problems associated with the reflection of radiant energy in a photomask assembly have been substantially reduced or eliminated. In a particular embodiment, the back side of the photomask includes an anti-reflective layer that substantially reduces reflection from the back side of the substrate. The inclusion of the anti-reflective layer on the back-side of the substrate improves the transmission of light through the photomask and decreases unwanted reflections.

The physical properties of transmission (T), reflection (R), and absorption (A) are related through the following formula:

$$T+R+A=1$$

As the light goes through a medium, by varying any one or two of these three properties, the other will be affected by use of this simple relationship. The current invention of backside anti-reflective coating is based on this fact as explained below.

In one aspect the present invention includes a photomask having a transparent substrate with a patterned absorber layer formed thereon. The substrate has both a front-side surface and a back-side surface. Additionally, an anti-reflective layer is deposited on the back-side of the substrate. More particularly, the anti-reflective coating may have a refractive index between 1.4 and 1.8.

In another aspect of the present invention, a method for reducing reflection in a photolithography system is described that includes providing a transparent substrate. The method also includes coating the backside surface of the substrate with an anti-reflective coating. In a particular embodiment, the anti-reflective coating may be applied to the back-side surface of the substrate using an evaporation technique, a sputtering technique or a spin-coating technique.

Important technical advantages of certain embodiments of the present invention include a photomask that improves the exposure uniformity across a wafer and reduces iso-dense bias effects on the wafer. In the present invention, light reflected from the absorber layer is not reflected from the back side of the substrate and down to the wafer surface. In this manner, the anti-reflective material reduces the iso-dense bias effects on the wafer that are caused by the unwanted reflected light at the surface of the wafer.

Another important technical advantage of the present invention is that the back-side anti-reflective layer improves the photolithography system throughput by decreasing overall reflectivity and thereby increasing the transmission of light to a wafer surface. Mathematically this comes from the above formula as the incident light goes through the substrate material the current invention will increase R, since $T=1-A-R$, as R increases and A remains near constant transmission T has to increase through the substrate thus improving the throughput of the optical system.

A further important technical advantage of the present invention includes a photomask that decreases critical dimension and pattern registration errors on a wafer surface. On a conventional photomask, critical dimension and pattern registration errors may occur on the wafer surface because stresses in the photomask have caused the photomask to bend or warp. These stresses effect the flatness of the photomask and cause printing errors. In the present invention, the addition of an anti-reflective layer on the back-side of the photomask may preferably introduce intrinsic stresses from the back side of the substrate. These stresses may balance or counteract the stresses from the front side of the substrate, and thus produce a photomask with increased flatness characteristics. Other technical advantages will be readily apparent to one skilled in the art from the following figures and descriptions.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention and their advantages are best understood by reference to FIGS. 1 through 6, where like numbers are used to indicate like and corresponding parts.

Figure 1:
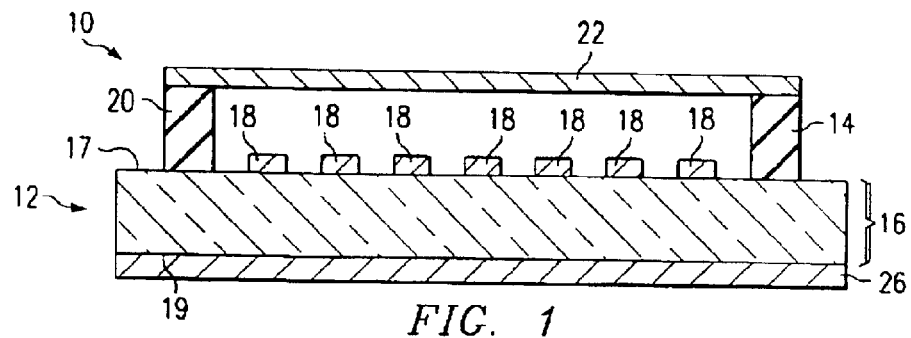
FIG. 1 illustrates a cross-sectional view of a photomask assembly with a pellicle including an anti-reflective layer formed on the back-side of a photomask according to teachings of the present invention.

FIG. 1 illustrates a cross-sectional, demonstrative view of photomask assembly 10. In the illustrated embodiment, photomask assembly 10 includes photomask 12 coupled to pellicle 14. Substrate 16 includes front-side surface 17 and back-side surface 19. Patterned layer 18, which may also be referred to as a 'thin film', is deposited on to front-side surface 17. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other size reticle suitable to project a circuit pattern or another desired image onto a wafer. Photomask 12 may further be a binary mask, a phase shift mask (PSM), an optical proximity correction (OPC) mask or any other type of mask suitable for use in a lithography system.

Figure 5:
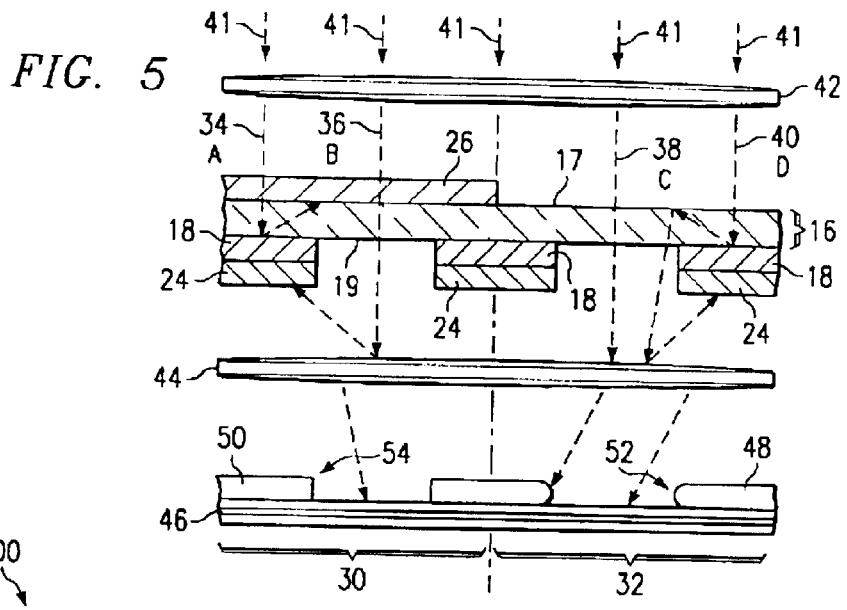
FIG. 5 illustrates a schematic comparison of a photolithography system including a prior art photomask with an uncoated back side surface and a photomask with an anti-reflective layer formed on the back-side of the substrate according to teachings of the present invention.

Photomask 12 includes patterned layer 18 on front-side surface 17 that creates a circuit image on photomask 12. The present embodiment also includes anti-reflective layer 26 deposited on back-side surface 19. When photomask assembly 10 is placed in a lithography system, electromagnetic energy is directed from an illumination source (as shown in FIG. 5) onto photomask 12 and the circuit image from patterned absorber layer 18 is projected through substrate 16 and on to the surface of a semiconductor wafer. Examples of such electromagnetic energy include, but are not limited to ultra violet, deep ultra violet (DUV), extreme ultra violet (EUV) and X-rays.

For some applications, substrate 16 may be a transparent material such as quartz, synthetic quartz, fused silica, magnesium fluoride ($MgF_2$), calcium fluoride ($CaF_2$), or any other suitable material that transmits approximately seventy-five percent or more of incident light having a wavelength between approximately 120 nanometers (nm) and approximately 450 nm. Patterned layer 18 may be a metal material such as chrome, chromium nitride, a metallic oxy-carbonitride, where the metal is selected from the group consisting of chromium, cobalt iron, zinc, molybdenum, niobium, tantalum, titanium, tungsten, aluminum, magnesium and silicon, and any other suitable material that absorbs light with wavelengths between approximately 120 nm and approximately 450 nm. In an alternative embodiment, patterned layer 18 may be a partially transmissive material, such as molybdenum silicide (MoSi), which has a transmissivity of approximately one percent to approximately thirty percent.

Photomask 12 may be formed from a photomask blank using known lithography processes. For example, a mask pattern file that includes data for patterned layer 18 may be generated from a circuit design pattern. The desired pattern may be imaged into a resist layer of the photomask blank using a laser, electron beam or X-ray lithography tool. For instance, a laser lithography tool may use an Argon-Ion laser that emits light having a wavelength of approximately 364 nanometers (nm). In another example embodiment, a laser lithography tool uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over transparent substrate 16.

In the present embodiment, an anti-reflective coating 26 with a refractive index between approximately 1.4 and approximately 1.8 and an absorption of approximately one percent (1%) is applied to back-side 19 of substrate 16. In a particular embodiment, backside anti-reflective layer 26 preferably reduces the amount of light reflected from the backside of the substrate by approximately four percent (4%). This reduction in reflection throughout the photomask may improve the transmission of light through photomask 12 by approximately four percent (4%) and thus, improve the throughput of the photolithography system.

Anti-reflective layer 26 may be formed on transparent substrate 16 by techniques such as evaporation, sputtering, spinning or any other suitable technique used to form a patterned absorber layer on a transparent substrate or another absorber layer. In one embodiment, anti-reflective layer 26 may be formed from $CaF_2$ or $MgF_2$ to a thickness between approximately one-hundred angstroms (Å) and approximately five-hundred angstroms. In another embodiment, an anti-reflective layer between approximately one-hundred angstroms and approximately three-hundred angstroms of silicon dioxide ($SiO_2$) or chromium oxide ($Cr_2O_3$) may be deposited on to the back-side of substrate 16. In a further embodiment, the anti-reflective layer may be metal nitroso (e.g., M—O—N) compounds or metal hallide (e.g., M—Cl—O—N, M—F—O—N or M—Cl—F—O—N) compounds where the metal element for each compound may be selected from the group consisting of chromium, cobalt, iron, zinc, molybdenum, niobium, tantalum, titanium, tungsten, aluminum, magnesium, hafnium and silicon. Further, the anti-reflective layer may include a multiple layer combination of any of the mentioned material as candidates listed above.

In alternative embodiments, the back side of the anti-reflective layer may include a coating of spin-on-glass and photoresist that has a thickness of approximately five-hundred angstroms to approximately one-thousand angstroms. The spin-on-glass and photoresist preferably have a low absorption to the selected exposure wavelength. In this embodiment the anti-reflective layer may be baked on for improved adhesion and mechanical integrity.

Frame 20 and pellicle film 22 form pellicle 14. Pellicle film 22 may be a thin film membrane formed of a material such as nitrocellulose, cellulose acetate, an amorphous fluoropolymer, such as Teflon® AF manufactured by E. I. du Pont de Nemours and Company, or another suitable deep ultraviolet film. Pellicle film 22 may be prepared by a conventional technique such as spin coating. Frame 20 is typically formed of anodized aluminum, although it could alternatively be formed of stainless steel, plastic or other suitable materials.

Pellicle film 22 protects photomask 12 from contaminants, such as dust particles, by ensuring that the contaminants remain a defined distance away from photomask 12. This may be especially important in a lithography system. During lithography, photomask assembly 10 is exposed to electromagnetic energy produced by an illumination source within the photolithography system. The electromagnetic energy may include light of various wavelengths, such as wavelengths approximately between the I-line and G-line of a Mercury arc lamp, DUV, VUV or EUV radiant energy, or X-rays. Pellicle film 22 is designed to allow a large percentage of the electromagnetic energy to pass through it. Because dust particles collected on pellicle film 22 will likely be out of focus at the surface of the wafer being processed, the exposed image on the wafer should be clear. Pellicle film 22 formed in accordance with the teachings of the present invention may be satisfactorily used with all types of electromagnetic energy and is not limited to any particular lightwaves described.

Figure 2:
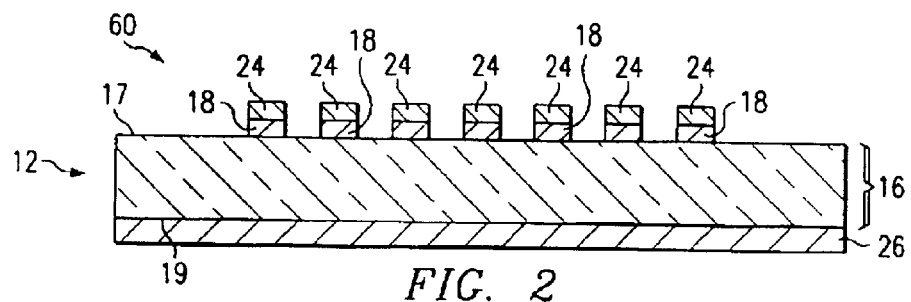
FIG. 2 illustrates a cross-sectional view of a photomask with a back-side anti-reflective layer according to the present invention.

FIG. 2 illustrates a cross-sectional view of photomask 60. Photomask 60 includes transparent substrate 16, two anti-reflective layers 24 and 26, and patterned absorber layer 18. Anti-reflective layer 24 is formed on patterned absorber layer 18 and a second anti-reflective layer 26 is formed on back-side 19 of substrate 16. Absorber layer 18 is formed on front-side 17 of substrate 16 and includes a pattern to be imaged on the surface of a wafer (as shown in FIG. 5). Anti-reflective layer 24 is patterned to substantially match the pattern of absorber layer 18.

Photomask 60 is comparable in size, shape, and type to photomask 12 as described in FIG. 1.

In an alternative embodiment, a pellicle (as shown in FIG. 1) having a thin film mounted to a frame, may be mounted to front-side 17 of substrate 16. In another alternative embodiment, a pellicle may be mounted to back-side 19 of substrate 16 in order to protect anti-reflective coating 26.

Figure 3:
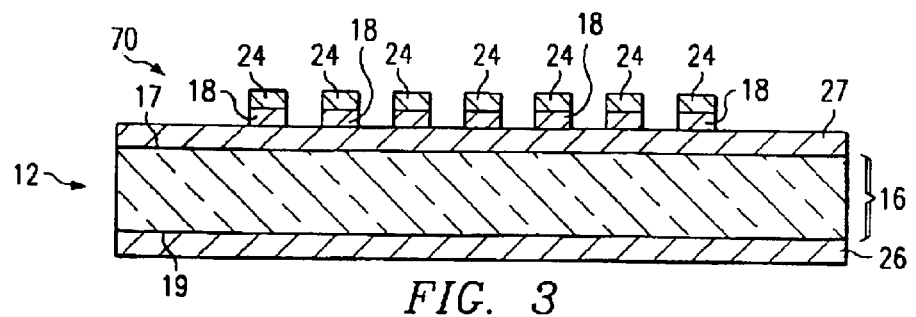
FIG. 3 illustrates a cross-sectional view of a photomask with a back-side anti-reflective coating and a front-side anti-reflective coating according to one embodiment of the present invention.

FIG. 3 illustrates a cross-sectional view of photomask 70. Photomask 70 includes three anti-reflective layers 24, 26, and 27. Photomask 70 also includes patterned absorber layer 18 and transparent substrate 16. Front-side anti-reflective layer 27 is applied to front-side 17 of substrate 16. In the present embodiment, absorber layer 18 is formed over front-side anti-reflective layer 27. Patterned anti-reflective layer 24 is formed on patterned absorber layer 18 with a pattern substantially matching that of patterned absorber layer 18. Back-side anti-reflective layer 26 is formed on back-side 19 of substrate 16. Photomask 70 is comparable in size, shape, and type to photomask 12 as described in FIG. 1.

Figure 4:
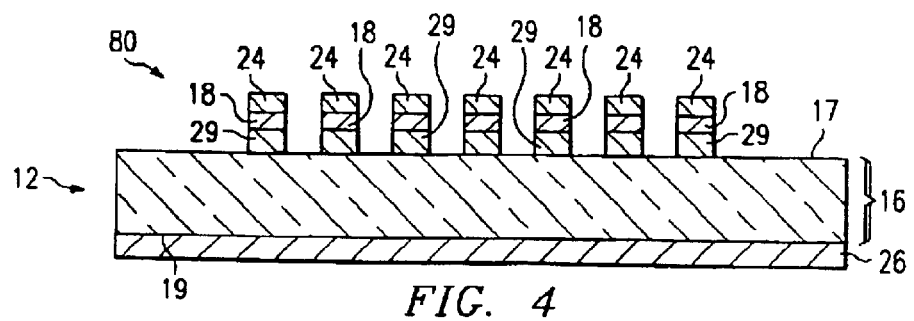
FIG. 4 illustrates a cross-sectional view of a photomask with a back-side anti-reflective coating and a anti-reflective coating according to another embodiment of the present invention.

FIG. 4 illustrates a cross-sectional view of photomask 80. Photomask 80 includes three anti-reflective layers 24, 26, and 29. Photomask 80 also includes patterned absorber layer 18 and transparent substrate 16. Front-side patterned anti-reflective layer 29 is applied to front-side 17 of substrate 16. In the present embodiment, absorber layer 18 is formed over front-side patterned anti-reflective layer 29. Patterned anti-reflective layer 24 is formed on patterned absorber layer 18 with a pattern substantially matching that of patterned absorber layer 18. Back-side anti-reflective layer 26 is formed on back-side 19 of substrate 16. Photomask 80 is comparable in size, shape, and type to photomask 12 as described in FIG. 1.

FIG. 5 illustrates a schematic comparison of a photolithography system including photomask 80 with a back-side surface partially coated with an anti-reflective coating and partially uncoated. For demonstrative purposes, this lithography system has been divided into a first side 30 and a second side 32. First side 30 shows an embodiment of a photomask according to the present invention while second side 32 shows a conventional photomask assembly. In the present demonstrative embodiment, substrate 16 includes back-side 19 and front-side 17. Patterned absorber layer 18 is applied to front-side of substrate 16. Patterned anti-reflective layer 24 is deposited adjacent to patterned absorber layer 18. For the demonstrative purposes of FIG. 4, patterned absorber layer 18 and patterned anti-reflective layer 24 span across the length of substrate 16. However, the anti-reflective layer 26 is applied to first half 30 of back-side 19 of substrate 16, the remaining portion (second half 32) of back-side 19 is not coated.

Demonstrative photomask 80 is shown disposed between first lens 42 and second lens 44. First lens, 42 represents a condenser lens system while second lens, 44 represents the reduction lens system of a typical wafer exposure system. Illumination indicated by arrows 41 is directed through first lens 42 to photomask 80. The illumination then passes through photomask 80 and second lens 44 before striking target wafer 46. Target wafer 46 includes devices So and 48 formed thereon.

The illumination shown in FIG. 4 is further divided into ray A 34, ray B 36, ray C 38, and ray D 40. Ray A 34 passes through back-side anti-reflective layer 26 and substrate 42 but is reflected off the back side 19 of patterned absorber layer 18. As shown, the reflected light terminates at the intersection of the back side 19 of the substrate and the anti-reflective layer. Because the reflection from Ray A 34 is not transmitted through the opening in absorber layer 18 to wafer 46, the contrast on the wafer surface is improved. As a result, corner 54 of device 50 is better defined than the rounded edge 52 of device 48.

Ray B 36 and Ray C 38 both pass through lens 42 and photomask 80 without substantial loss. However, due to the presence of the backside anti-reflective layer 26 Ray B 36 is expected to have higher transmission than Ray C 38 thus demonstrating one of the aspects of the current invention. When Ray B 36 and Ray C 38 pass through second lens 44, some reflection may occur which will be substantially stopped at anti-reflective layer 24.

Ray D 40 passes through transparent substrate 16 but is reflected off the back side of absorber layer 18. The reflected light is then reflected off the back side of the uncoated substrate 16 and passes through the opening in absorber layer 18. Ray D 40 eventually reaches the surface of wafer 46 at an undesirable angle and may cause poorly defined geometries such as the rounded corner 52 of device 48. Additionally, this effect may be intensified for dense areas of the pattern compared to isolated areas.

FIG. 5 shows photomask 110 incorporated into lithography system 100. Lithography system 100 includes energy source 300 which may also be referred to as an 'illumination source'. Energy source 300 provides electromagnetic radiation (EMR) that is projected onto photomask 110. Examples of such EMR may include, without limitation, ultra violet, deep ultra violet (DUV), extreme ultra violet (EUV) and X-rays. In the present embodiment, photomask 110 includes mask field 112; mask field 112 includes a selected arrangement of areas that contain patterned absorber and areas that are transparent (as shown in FIGS. 1–4). In the present embodiment, the areas of photomask 110 outside of mask field 112 are opaque. In alternative embodiments, however, the area outside of mask field 112 may be transmissive or partially transmissive.

For transmissive systems, the EMR passes through areas of the mask field of photomask 110 and the pattern or circuit image in mask field 112 is projected onto the surface of an object being imaged, such as a surface 118 of semiconductor wafer 120. The area of semiconductor wafer 120 that receives the EMR transmitted through mask field 112 is known as the image field 116. As described above, a patterned layer of absorber material (such as absorber layer 18) may be applied to the front-side of photomask 110). In the present embodiment, when photomask 110 is used to image wafer 120, EMR may be projected onto photomask 110 from the back-side (i.e., the side opposite the front-side) in order to expose image field 116.

In operation, illumination source 108 and photomask 110 of lithography system 100 may be moved incrementally or 'stepped' across wafer 120 to expose a series of image fields 116 on surface 118. Alternatively, illumination source 108 and photomask may remain stationary and wafer 120 may be stepped beneath it. In some embodiments, photomask 110 may include alignment marks or similar provisions to allow the lithography system to properly align image field 116 for subsequent processing.

Figure 6:
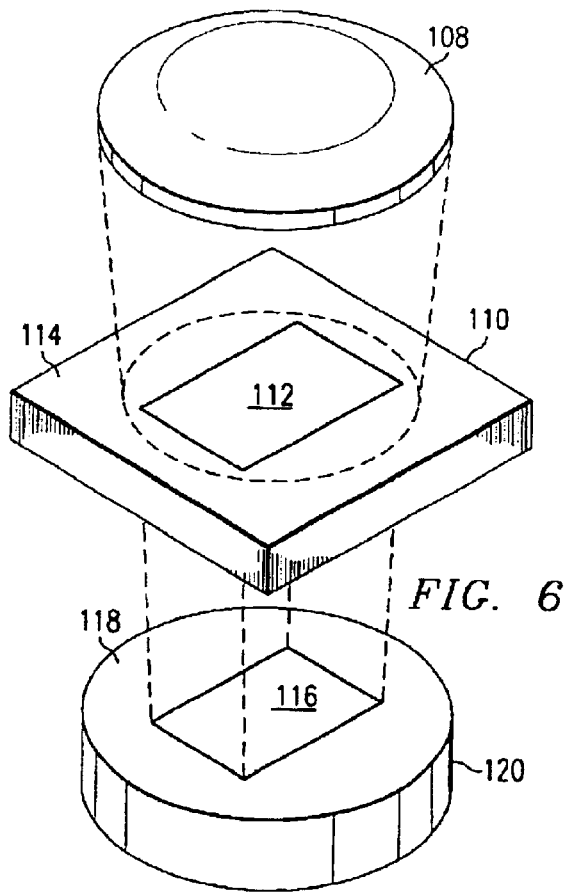
FIG. 6 illustrates a schematic isometric view of a photomask being used to image a wafer.
Figure 7:
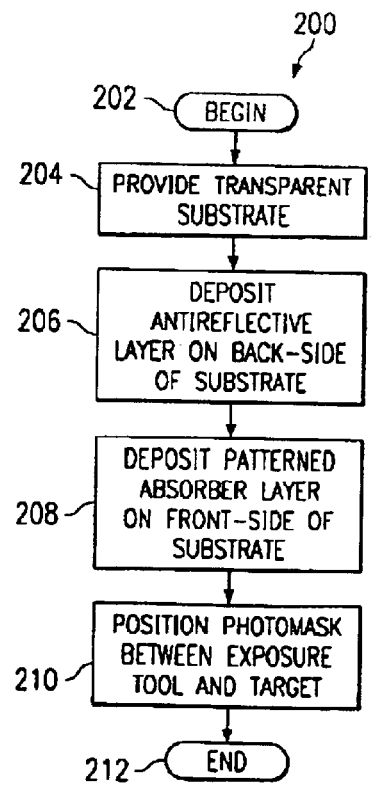
FIG. 7 illustrates a flow diagram showing a method of reducing reflection in a photolithography system according to the present invention.

Now referring to FIG. 6, a flow diagram that illustrates a process for reducing reflection in a lithography system is shown. The method includes providing a transparent substrate 204. For some applications, the transparent substrate provided may be a transparent material such as quartz, synthetic quartz, fused silica, magnesium fluoride ($MgF_2$), calcium fluoride ($CaF_2$), or any other suitable material that transmits approximately at least seventy-five percent of incident light or EMR having a wavelength between approximately 120 nanometers (nm) and approximately 450 nm. In preferred embodiments the percentage of transmissive light or EMR is greater than ninety percent.

A layer of anti-reflective coating may be applied to the back-side of the substrate 206. The anti-reflective coating may have a refractive index between approximately 1.4 and approximately 1.8 and an absorption of approximately one percent (1%). The anti-reflective layer may be formed from $CaF_2$ or $MgF_2$ to a thickness between approximately one-hundred angstroms (Å) and approximately five-hundred angstroms. In another embodiment the anti-reflective layer may be formed from silicon dioxide ($SiO_2$) or chromium oxide ($Cr_2O_3$) between approximately one-hundred angstroms and approximately three-hundred angstroms. In another embodiment the anti-reflective layers may be formed from a metal nitroso compounds or a metal hallide compound. In yet another embodiment the anti-reflective layer may be formed from a combination of spin-on-glass and photoresist that has a thickness of approximately five hundred angstroms to approximately one thousand angstroms. The anti-reflective coating may be applied to the substrate using techniques such as evaporation, sputtering, spinning or any other suitable technique used to form a patterned absorber layer on a transparent substrate or another absorber layer. The anti-reflective layer may be a multi layer combining any of the materials listed above.

The material and thickness of the anti-reflective layer may be selected according to the desired anti-reflective and absorption qualities. Additionally, the anti-reflective layer may be formed in order to counteract the stresses introduced to the front-side of the substrate by the patterned absorber layer or other layers deposited thereon.

A patterned absorber layer may also be deposited on the front-side of the substrate 208. The formation of the patterned absorber layer may use any known technique or process for forming the patterned absorber layer. Additionally, a patterned anti-reflective layer may be deposited over the patterned absorber layer. Also, in some applications, an anti-reflective layer may be deposited over the surface of the substrate prior to the formation of the patterned absorber layer.

In alternative embodiments, the formation of the patterned absorber layer may include additional steps of depositing, polishing, etching, etc. to form the desired pattern. Additionally, a protective pellicle may also be attached to the substrate to protect it from particles of dust or other impurities that could negatively impact the performance of the photomask.

After the photomask is complete, the photomask is placed in a lithography system for use 210. The photomask is placed between an illumination source and a target wafer. The photomask is typically positioned such that the back-side surface of the photomask faces the illumination source. In operation, the illumination source emits EMR which passes through the photomask and projects the pattern of the patterned absorber layer onto the target wafer.

Although the present invention has been described in detail, it should be understood that various changes, substitutions, and alterations can be made without departing from the spirit and scope of the invention as defined by the appended claims.

What is claimed is:

1. A photomask comprising:
   a transparent substrate having a front-side surface and a back-side surface;
   a patterned absorber layer deposited on the front-side surface;
   a patterned anti-reflective layer deposited on the patterned absorber layer; and
   a single-layer anti-reflective coating deposited on the back-side surface, the anti-reflective layer operable to improve flatness characteristics of the substrate;
   wherein the photomask comprises the single-layer anti-reflective coating, the substrate, the patterned anti-reflective layer, and the patterned absorber layer arranged in that order.

2. The photomask of claim 1 further comprising:
   a front-side pellicle frame attached to the front-side surface; and a pellicle attached to the front-side frame.

3. The photomask of claim 1 further comprising:

a back-side pellicle frame attached to the back-side of the substrate; and a pellicle attached to the back-side pellicle frame.

4. The photomask of claim 1 further comprising the single-layer antireflective coating having a refractive index of between approximately 1.4 and 1.8.

5. The photomask of claim 1 further comprising the single-layer antireflective coating having a refractive index of approximately 1.6.

6. The photomask of claim 1 further comprising the single-layer antireflective coating applied to the back-side by a process selected from the group consisting of: evaporation, sputtering, ion beam deposition and spin-coating.

7. The photomask of claim 1 further comprising the single-layer antireflective coating formed from Calcium Fluoride and having a thickness between approximately 100 angstroms and 500 angstroms.

8. The photomask of claim 1 further comprising the single-layer antireflective coating formed from Magnesium Fluoride and having a thickness between approximately 100 angstroms and 500 angstroms.

9. The photomask of claim 1 further comprising the single-layer antireflective coating formed from silicon dioxide and having a thickness between approximately 100 angstroms and 300 angstroms.

10. The photomask of claim 1 further comprising the single-layer antireflective coating formed from chromium oxide and having a thickness between approximately 100 angstroms and 300 angstroms.

11. The photomask of claim 1 further comprising the single-layer antireflective coating formed from a metal nitroso compound.

12. The photomask of claim 1 further comprising the single-layer antireflective coating formed from a metal hallide compound.

13. A photomask assembly comprising:

a transparent substrate having a front-side surface and a back-side surface;

a patterned absorber layer deposited on the front-side surface;

a patterned antireflective layer deposited on the patterned absorber layer;

a single-layer anti-reflective coating deposited on the back-side surface, the anti-reflective layer operable to improve flatness characteristics of the substrate;

wherein the photomask comprises the single-layer anti-reflective coating, the substrate, the patterned antireflective layer, and the patterned absorber layer arranged in that order;

a pellicle frame attached to the front-side surface; and a pellicle attached to the pellicle frame.

14. The photomask assembly of claim 13 further comprising the single-layer anti-reflective coating having a refractive index of between approximately 1.4 and 1.8.

15. The photomask assembly of claim 13 further comprising the single-layer anti-reflective he coating deposited on the back-side by a process selected from the group consisting of: evaporation, sputtering, ion beam deposition and spin-coating.

16. The photomask assembly of claim 13 further comprising the single-layer anti-reflective coating formed from Magnesium Fluoride and having a thickness between approximately 100 angstroms and 500 angstroms.

17. A method for reducing reflection in a photolithography system comprising:

providing a transparent substrate having a front-side surface and a back-side surface;

forming a patterned absorber layer on the front-side surface:

forming a patterned antireflective layer on the patterned absorber layer; and coating the back-side surface with a single-layer anti-reflective material operable to improve flatness characteristics of the substrate, such that the single-layer anti-reflective material, the substrate, the patterned antireflective layer, and the patterned absorber layer are arranged in that order.

18. The method of claim 17 further comprising selecting a single-layer antireflective material having a refractive index of between approximately 1.4 and 1.8.

19. The method of claim 17 wherein the step of coating the back-side surface further comprises coating the back-side surface using a technique selected from the group consisting of: evaporation, sputtering, ion beam deposition and spin-coating.

20. The method of claim 17 wherein the photolithography system comprises an illumination source operable to provide illumination from x-ray to 450 nm of the light spectrum.

* * * * *